US009806469B2

(12) United States Patent
Barr

(10) Patent No.: US 9,806,469 B2
(45) Date of Patent: Oct. 31, 2017

(54) ELECTRICAL CONNECTORS INCLUDING ELECTROMAGNETIC INTERFERENCE (EMI) ABSORBING MATERIAL

(71) Applicant: 3M INNOVATIVE PROPERTIES COMPANY, St. Paul, MN (US)

(72) Inventor: Alexander W. Barr, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/944,252

(22) Filed: Nov. 18, 2015

(65) Prior Publication Data

US 2016/0072232 A1 Mar. 10, 2016

Related U.S. Application Data

(63) Continuation of application No. 13/884,756, filed as application No. PCT/US2011/063939 on Dec. 8, 2011, now Pat. No. 9,225,120.

(Continued)

(51) Int. Cl.

| | |
|---|---|
| ***H05K 9/00*** | (2006.01) |
| ***H01R 13/6598*** | (2011.01) |
| ***H01R 13/6586*** | (2011.01) |
| ***H01R 13/6585*** | (2011.01) |
| *H01R 13/6597* | (2011.01) |

(52) U.S. Cl.

CPC ..... *H01R 13/6598* (2013.01); *H01R 13/6585* (2013.01); *H01R 13/6586* (2013.01); *H01R 13/6597* (2013.01)

(58) Field of Classification Search

CPC .................................................. H01R 13/6586

See application file for complete search history.

(56) References Cited

U.S. PATENT DOCUMENTS 4,519,664 A * 5/1985 Tillotson ............ H01R 13/6598 333/12

5,304,964 A * 4/1994 DiMarco .............. H01R 13/719 333/181

(Continued)

FOREIGN PATENT DOCUMENTS

WO WO 2004/091055 10/2004

OTHER PUBLICATIONS

PCT International Search Report for PCT/US2011/063939 dated Feb. 28, 2012, 4 pages.

*Primary Examiner* — Hung V Ngo

(74) *Attorney, Agent, or Firm* — Robert S. Moshrefzadeh

(57) ABSTRACT

Examples of electrical connectors that incorporate electromagnetic interference (EMI) absorbing materials are described. In one example, an electrical connector includes a first pair of conductors, a second pair of conductors, and electromagnetic interference (EMI) absorbing material at least partially separating the first pair of conductors from the second pair of conductors. Each of the first and second pairs of conductors defines one of a differential pair or a signal conductor/ground pair. The EMI absorbing material may be configured to attenuate, primarily by absorption, an electromagnetic field generated due to transmission of electrical signals via one of the first pair and second pair of conductors to reduce the electromagnetic inference from the electromagnetic field on the other of the first pair and second pair of conductors.

1 Claim, 7 Drawing Sheets

Related U.S. Application Data

(60) Provisional application No. 61/423,235, filed on Dec. 15, 2010.

(56) References Cited

U.S. PATENT DOCUMENTS

| | | | | | |
|---|---|---|---|---|---|
| 5,461,351 | A * | 10/1995 | Shusterman | H01R 13/7197 | 174/359 |
| 6,302,738 | B1 * | 10/2001 | Tonus | H01Q 17/00 | 439/607.23 |
| 6,320,122 | B1 | 11/2001 | Dickey et al. | | |
| 6,443,740 | B1 | 9/2002 | Evans | | |
| 6,471,549 | B1 | 10/2002 | Lappöhn | | |
| 2004/0001299 | A1 | 1/2004 | van Haaster et al. | | |
| 2004/0057187 | A1 | 3/2004 | Kuboshima et al. | | |

* cited by examiner

ELECTRICAL CONNECTORS INCLUDING ELECTROMAGNETIC INTERFERENCE (EMI) ABSORBING MATERIAL

TECHNICAL FIELD

The disclosure relates to electrical connectors and electrical connector assemblies.

BACKGROUND

An electrical connector can allow for the connection of integrated circuits on circuit boards to cables or electronic devices. Electrical signals propagate through conductors of the electrical connector as the signals pass to/from the circuit board. In some examples, electrical interconnections are not difficult to form when signal line densities are relatively low. In addition, signal integrity is much less of a concern when designing connectors for relatively slow data rate applications. However, equipment manufacturers and consumers continually desire ever higher signal line densities and faster data rates.

Electrical connectors with relatively high signal line densities have been developed for use with high speed circuits (e.g., circuits with transmission rate of at least 5 GHz). However, with higher signal lines densities and faster data rates, signal integrity may by undesirably influenced as a result of increased interference between circuits, for example. Available high speed interconnect solutions can be complex, utilizing precisely fabricated component designs that are sensitive to even small manufacturing variations, and thus expensive and difficult to manufacture.

SUMMARY

In general, the disclosure relates to electrical connectors including electromagnetic interference (EMI) absorbing material to reduce crosstalk between adjacent signal conductors of the electrical connector. For example, the EMI absorbing material may be provided to attenuate, primarily through absorption, electromagnetic fields generated by the transmission of electrical signals through one or more signal conductors within an electrical connector. In some examples, the attenuation of an electromagnetic field may reduce the crosstalk or other interference associated with the transmission of electrical signals via conductors within the electrical connector to increase the integrity of signals transmitted across the respective electrical connector.

In one example, the disclosure is directed to an electrical connector comprising a first pair of conductors; a second pair of conductors; and electromagnetic interference (EMI) absorbing material at least partially separating the first pair of conductors from the second pair of conductors, where each of the first pair and second pair of conductors define one of a differential pair or a signal conductor/ground pair. The EMI absorbing material is configured to attenuate, primarily by absorption, an electromagnetic field generated due to transmission of electrical signals via one of the first pair and second pair of conductors to reduce the electromagnetic inference from the electromagnetic field on the other of the first pair and second pair of conductors, and any percentage attenuation of an electromagnetic field between the respective conductors provided by the EMI absorbing material is less than the percentage attenuation of the electromagnetic field provided by the EMI absorbing material separating the first pair of conductors from the second pair of conductors.

In another example, the disclosure is directed to an electrical assembly comprising a first electrical connector; a second electrical connector mated with the first electrical connector; a first pair of conductors and a second pair of conductors, where each of the first pair and second pair of conductors define one of a differential pair or a signal conductor/ground pair; and electromagnetic interference (EMI) absorbing material at least partially separating the first pair of conductors from the second pair of conductors when the first connector is mated with the second electrical connector. The EMI absorbing material is configured to attenuate, primarily by absorption, an electromagnetic field generated due to transmission of electrical signals via one of the first pair and second pair of conductors to reduce the electromagnetic inference from the electromagnetic field on the other of the first pair and second pair of conductors, and any percent attenuation of an electromagnetic field between the respective conductors provided by the EMI absorbing material is less than a percent attenuation of the electromagnetic field provided by the EMI absorbing material separating the first pair of conductors from the second pair of conductors.

In another example, the disclosure is directed to an electrical connector comprising a first pair of conductors comprising a first conductor at least partially surrounded by a first grounded shield to define a first signal conductor/ground pair; a first dielectric layer separating the first conductor from the first grounded shield; a second pair of conductors comprising a second conductor at least partially surrounded by a second grounded shield to define a second signal conductor/ground pair; a second dielectric layer separating the second conductor from the second grounded shield; and electromagnetic interference (EMI) absorbing material surrounding both the first and second pairs of conductors.

In another example, the disclosure relates to an electrical connector comprising a first plurality of conductors; a second plurality of conductors adjacent to the first plurality of conductors; electromagnetic interference (EMI) absorbing material; and a grounded shield member, where the first plurality of conductors and the grounded shield member form a first plurality of signal conductor/ground pairs and the second plurality of conductors and the grounded shield member form a second plurality of signal conductor/ground pairs. The first plurality of conductors are separated from the second plurality of conductors by the grounded shield member and the EMI absorbing material, and respective conductors of the first plurality of conductors are separated from one another by the EMI absorbing material.

In another example, the disclosure relates to a method comprising transmitting data via one or more of the electrical connectors and electrical connector assemblies described in the disclosure. The transmission of data via electrical connectors and electrical connector assemblies of the disclosure may include the transmission of electrical signals via one or more conductors of the electrical connectors and electrical connector assemblies.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
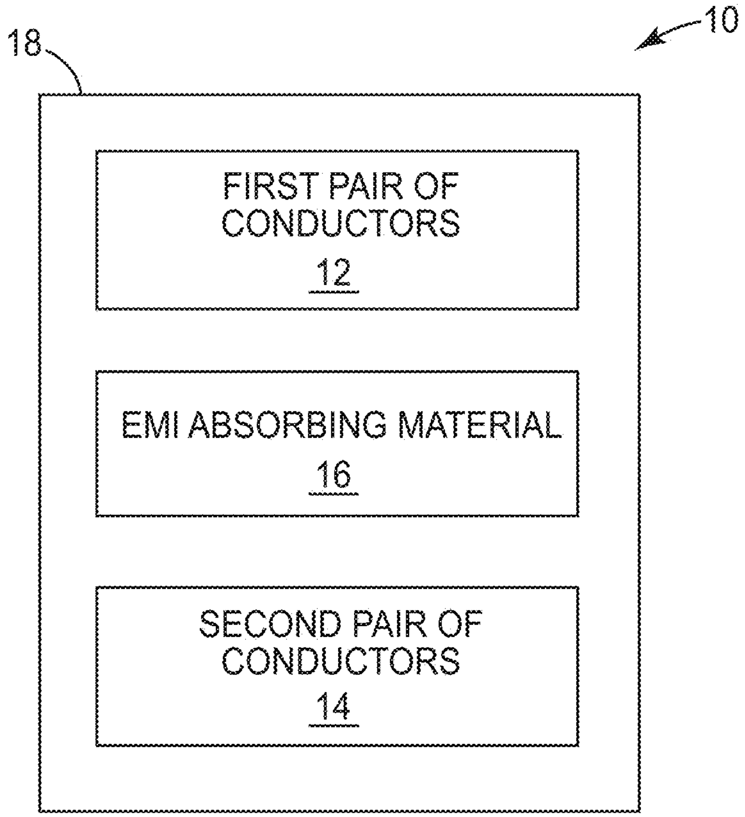
FIG. 1 is a conceptual block diagram illustrating an example electrical connector.

FIG. 1 is a conceptual block diagram illustrating an example electrical connector 10. Electrical connector 10 includes a first pair of conductors 12 and a second pair of conductors 14 located at least partially within an outer housing 18 of electrical connector 18. In general, electrical connector 10 may be used to electrically couple two or more electrical circuits to each other. Electrical connector 10 may electrically connect conductors of two or more electrical wires or cables to one another, or may electrically connect one or more electrical wires or cables to an electrical terminal Electrical connector 10 may provide a permanent or temporary connection between the two or more electrical circuits.

Electrical connector 10 is not limited to any specific type of electrical connector configuration or standard but may be any suitable electrical connector including two or more pairs of conductors for propagating electrical signals, e.g., to transmit data across electrical connector 10. In one example, electrical connector 10 may be configured as a backplane connector. In other examples it could be a board-to-board or cable-to-board connector. In some examples, electrical connector 10 may support data transfer rates of greater than approximately 10 Gb/s, such as, e.g., rates of between approximately 10 Gb/s and approximately 20 Gb/s. Moreover, while electrical connector 10 is illustrated as including two pairs of conductors 12 and 14, examples of the disclosure are not limited as such. In some examples, electrical connector 10 may include more than two pairs of conductors, such as, e.g., three, four, five, or more than five pairs of conductors.

Electrical signals may propagate through each pair of conductors 12 and 14 transmit data via electrical connector 10. In some examples, each of first pair of conductors 12 and second pair of conductors 14 may be configured either as differential pairs or signal conductor/ground pair. For example, first pair of conductors 12 and second pair of conductors 14 may both define a differential pair or a signal conductor/ground pair, or first pair of conductors 12 may define a differential pair and second pair of conductors 16 may define a signal conductor/ground pair.

For instances in which first pair of conductors 12 and/or second pair of conductors 14 defines a differential pair of conductors, the differential pair of conductors may allow for the transmission of data via electrical connector 10 using differential signaling techniques. Differential signaling involves the transmission of two complimentary signals over the pair of conductors, and can be used for both analog signaling and digital signaling. The conducted electrical signals may be received by a receiving device that reads the difference in voltage, for example, between by the two signals carried by respective conductors of pair of conductors 12 and/or 14.

Alternatively, for instances in which first pair of conductors 12 and/or second pair of conductors 14 define a signal conductor/ground pair, the signal conductor/ground pair may allow for transmission of data via electrical connector 10 using single-ended signaling. Single-ended signaling involves the use of one conductor of the pair to carry a variable voltage representative of the data signal while the other conductor is grounded to act as a reference voltage. Variations in the voltage carried by the signal conductor may be read with regard to the reference voltage of the grounded conductor.

Regardless of whether first pair of conductors 12 and second pair of conductor 14 defined differential pairs or signal conductor/ground pairs, crosstalk may be experienced between first pair of conductors 12 and second pair of conductor 14. Crosstalk may be defined as any unwanted signal induced on a conductor (referred to in some cases as a "victim conductor") as a consequence of being exposed to the electromagnetic field generated by energy flowing through another conductor (referred to in some instances as an "aggressor conductor"). In the example of FIG. 1, during the transmission of data through electrical connector 10, energy flowing within the conductors of first pair of conductors 12 may generate an electromagnetic field that induces an unwanted signal in one or both of the conductors of second pair of conductors 14, and vice versa.

The level of crosstalk that may be experienced by the victim conductor may be directly related to the voltage over time slope of the changing signals carried by the aggressor conductor as well as the proximity of the victim conductor to the aggressor conductor. In high speed digital communication applications, where signals may switch at high rates (e.g., above 10 Gb/s) and signal conductors may be arranged at relatively close to each other (e.g., pitches closer than 2 mm), crosstalk can exceed levels of more than 20% of a driven signal level.

In some examples, in order to address this crosstalk phenomenon, grounded shield conductors may be provided between adjacent signal lines. The intent of this action is to provide a termination surface for electric field lines to reduce capacitive coupling to the victim conductor as well as supplying a ground current return path to help cancel magnetic field coupling with the victim conductor. Such shielding can, in some cases, virtually eliminate the capacitive coupling between an aggressor and a victim. However, unless a conductor structure (such as coax structure) is used that provides exact cancellation or blockage of the magnetic field pattern created by the aggressor conductor, magnetically induced crosstalk may still be observed by the victim conductor. Since few options exist for creating effectively perfect signal-ground cancellation or containment structures, it could be beneficial to attenuate any time changing magnetic fields that escape shielding structures further reduce crosstalk to neighboring victim conductors.

In accordance with one or more examples of the disclosure, as shown in FIG. 1, electrical connector 10 may also include an electromagnetic interference (EMI) absorbing material 16. EMI absorbing material 16 may at least partially separate first pair of conductors 12 and second pair of conductors 14 from each other within electrical connector 10. As disposed relative to first pair of conductors 12 and second pair of conductor 14, EMI absorbing material 16 may attenuate an electromagnetic field generated due to transmission of electrical signals via one of the first pair and second pair of conductors 12, 14 to reduce the electromagnetic inference from the electromagnetic field on the other of the first pair and second pair of conductors 12, 14. For example, EMI absorbing material 16 may attenuate an electromagnetic field generated as a result of the flow of energy through one or more of the conductors of first pair of conductors 12 in a manner that reduces the electromagnetic interference caused by the generated electromagnetic field on second pair of conductors 14, and vice versa. In this way, EMI absorbing material 16 may reduce crosstalk between first pair of conductors 12 and second pair of conductors 14.

EMI absorbing material 16 may attenuate an electromagnetic signal generated by first pair of conductors 12 and/or second pair of conductors 14 primarily through absorption of the generated electromagnetic field. Such a mechanism is in contrast to a shielding material which may primarily reflect an electromagnetic field rather than absorb the electromagnetic field. As will be described below, in some examples, such a shielding material may be used in combination with EMI absorbing material 16 to reduce interference between first pair of conductors 12 and second pair of conductors 14. In any case, the attenuation of an electromagnetic field generated by the transmission of electrical signals through first pair conductor 12 and/or second pair of conductors 14 by EMI absorbing material 16 may reduce the interference between the respective pairs, e.g., by reducing or substantially eliminating unwanted signal induced within the "victim conductor" by the electromagnetic field generated by the "aggressor conductor."

EMI absorbing material 16 may be any suitable material capable of attenuating an electromagnetic field, primarily through absorption, generated by the flow of energy through one or both conductor of first pair of conductors 12 and/or second pair of conductors 14. In some examples, EMI absorbing material 16 may be a dielectric material having a magnetic permeability of greater than one and which exhibits a non-negligible magnetic loss tangent. A non-negligible magnetic loss tangent may refer to a loss tangent value greater than approximately 0.1. EMI absorbing material 16 may have a dielectric constant similar to many dielectrics used in electronic applications (e.g., a value greater than approximately 2) as well as a relatively high resistivity (e.g., a value on the order of approximately 100 ohms/square or greater).

Example EMI absorbing material include but are not limited to ferromagnetic materials such as, e.g., ferrite materials. A ferrite material may be formed of non-conductive, Fe-oxide compounds including $Fe_2O_3$ and/or $Fe_3O_4$ as well as other metal oxides. In some examples, EMI absorbing material 16 may be formed as polymeric resin layer including ferromagnetic powder bound within the resin material. In some examples, the composition and structure of EMI absorbing material 16 may be selected to absorb electromagnetic waves at one or more frequencies generally associated with the electromagnetic field generated by first pair of conductors 12 and/or second flow of conductors during the transmission of data at a prescribed rate.

EMI absorbing material 16 may have a single layer or multi-layer structure. In some examples, EMI absorbing material 16 may have multiple layers having different compositions. The different composition of the layers may be selected to absorb electromagnetic waves at different frequencies. In this manner, the composite EMI absorbing material 16 may absorb electromagnetic waves over a wider range of frequencies than provided by a single EMI absorbing material. As will be describe below, in some examples, one or more layers of EMI absorbing material 16 may be combined with one or more layers of shielding material to provide a composite structure that both absorbs and reflects electromagnetic waves to attenuate an electromagnetic field generated by the transmission of electrical signals within first pair of conductors 12 and/or second pair of conductors 14 to reduce interferences between the respective pairs.

As disposed within electrical connector 10, EMI absorbing material 16 may at least partially separate first pair of conductors 12 from second pair of conductors 14. In some examples, EMI absorbing material 16 may be provided directly between first conductive pair 12 and second conductive pair 14 to separate first conductive pair 12 from second conductive pair 14. In general, the location of the of EMI absorbing material 16 relative to first pair of conductors 12 and second pair of conductors 14 may allow EMI absorbing material 16 to attenuate all or a portion of the electromagnetic field generated by first pair of conductors 14 in a manner that reduces EMI interference within second pair of conductors 14, and vice versa. In some examples, EMI absorbing material 16 may be partially or substantially entirely surround first pair of conductors 12 as well as second pair of conductors 14. In a configuration in which EMI absorbing material 16 substantially entirely surrounds a pair of conductors, EMI absorbing material 16 may absorb an electromagnetic field from substantially all directions. Such a configuration may be used for embodiments in which electrical connector 10 includes more than two pairs of conductors, where multiple different electromagnetic fields may be generated from different directions within electrical connector 10.

As will be illustrated below, electrical connector 10 may also include dielectric insulator material that separates the individual conductors that form a pair of conductors. The dielectric insulator material may separate EMI absorbing material 16 from each conductor of first pair of conductors 12 and second pair of conductors 14. Example dielectric insulator materials for surrounding respective conductors includes, but are not limited to, resins such as liquid crystal polymer (LCP), polybutylene terephthalate (PBT), polycyclohexylene dimethylene terephthalate (PCT), and high temperature nylon (HTN).

The reduction in interference provided by EMI absorbing material 16 due to the attenuation of an electromagnetic field as described herein may depend on a number of factors, such as, e.g., the rate at which data is transmitted via first and second pairs of conductors and the proximity of the pairs of conductors. In some examples, data may be transmitted using first pair of conductors and/or second pair of conductors 14 at a rate of greater than 1 Gb/s. In such an example, EMI absorbing material 16 may be provided within electrical connector 10 to reduce the level of crosstalk between the first and second pairs of conductors 12, 14 by at least 3 dB during transmission of the data. In some examples, such a level of reduction may be provided when first pair of conductor 12 is within approximately 6 millimeters (mm) of second pair of conductors 14, such as, e.g., within approximately 4 mm or between approximately 2 mm and approximately 0.5 mm.

In some examples, EMI absorbing material 16 does not separate respective conductors that form a pair of conductors within electrical connector 10. For example, first pair of conductors 12 may be substantially free of EMI absorbing material 16 between the respective conductors that define first pair of conductors 12. In some cases, only a dielectric material as described above may separate the respective conductors. In other examples, EMI absorbing material 16 may be present at some level between respective conductors of a pair of conductors. However, in each configuration, any attenuation of an electromagnetic field between the respective conductors provided by the EMI absorbing material is less than the attenuation of the electromagnetic field provided by the EMI absorbing material separating the first pair of conductors from the second pair of conductors.

As noted above, in some examples, electrical connector 10 may optionally include a shield member formed of an electromagnetic shielding material. The shield member may provide for additional attenuation of an electromagnetic field generated due to transmission of electrical signals via one of the first pair and second pair of conductors 12, 14 to reduce the electromagnetic inference from the electromagnetic field on the other of the first pair and second pair of conductors 12, 14. Unlike EMI absorbing material 16, which attenuates an electromagnetic field primarily by absorption, a shield member formed of a electromagnetic shielding material may attenuate a generated electromagnetic field primarily through reflection of the electromagnetic field. In some examples, such a shielding material may be combined with EMI absorbing material 16 to provide for a level of overall electromagnetic field attenuation that is greater than the level of attenuation provided by the shielding material and EMI absorbing material 16 individually.

As noted above, in some examples, shield material may be provided with EMI absorbing material to form a multiple layer structure. In some examples, a shielding material may be provided on the outside of EMI absorbing material 16 surrounding first pair of conductors 12. In such a configuration, any electromagnetic waves generated due to the transmission of signals through one or more conductors of a pair of conductors may reflected back towards EMI absorbing material by the shielding material, e.g., for further absorption by EMI absorbing material 16, rather than allowing the electromagnetic field to interfere with second pair of conductors 14. Additionally or alternatively, the shielding material may be disposed between a pair of conductors and EMI absorbing material 16 within electrical connector 10. The shielding material, primarily through reflection, may be provided to contain a electromagnetic field within the conductive pair generating the electromagnetic field as well as shield the same pair of conductors from any external electromagnetic field such as one generated by another conductor pair in electrical connector 10.

Example electromagnetic shielding material may include conductive materials (e.g., materials with a conductivity greater than $1\times10^6$ S/m) such as, e.g., Cu, Al, or other metals with suitable conductivity and alloys thereof. In some examples, the shield material may include a Cu material plated with Ni and may include an overplate of Sn, SnPb, or precious metals.

In some examples, electrical connector 10 may be formed of two or more structures configured to mate with each other to form an electrical connector assembly. For example, electrical connector 10 may include a first male electrical connector and second female electrical connector, where the first male electrical connector includes a plurality of pin conductors configured to be received in respective receptacles defined in the second electrical connector. For examples in which electrical connector 10 includes a plurality of connectable structures, the respective structures may be permanently or temporarily mated with each other. When respective structures are mated with one another, electrical connector 10 defines first pair of conductors 12 and second pair of conductors 14 separated at least partially by EMI absorbing material 16, as described above.

In some examples, respective structures of electrical connector 10 may include substantially all, a portion, or substantially none of EMI absorbing material 16. For example, for a two connector assembly, when in an unmated configuration, the first connector may include substantially all of EMI absorbing material 16 and the second connector may include substantially none of EMI absorbing material 16. Alternatively, each of the first connector and the second connector may include portions of EMI absorbing material 16. Whatever the case may be, when mated within one another, the two connectors define first and second pairs of conductors 12, 14 separated by EMI absorbing material 16 in a configuration in which EMI absorbing material 16 is configured to attenuate, primarily by absorption, an electromagnetic field generated due to transmission of electrical signals via one of the first pair and second pair of conductors 12, 14 to reduce the electromagnetic inference from the electromagnetic field on the other of the first pair and second pair of conductors 12, 14, and vice versa. Electrical connectors that form electrical connector 10 may include electromagnetic shield material in a similar fashion in addition to that of EMI absorbing material 16. In some examples, no one individual connector includes EMI absorbing material 16 or a combination of EMI absorbing material 16 and shield material in an amount or configuration capable of attenuating a generate electromagnetic field as desired. Rather, only in a mated configuration do the electrical connector portions form electrical connector 10 in a manner in which a generated electromagnetic field is attenuated through absorption or absorption and reflection to reduce the interference within electrical connector 10, as described herein, to a desired level.

FIGS. 2A-2E are schematic diagrams illustrating various example electrical connector configurations including EMI absorbing material 16. Each example connector is shown as a cross-section view along a plane substantially orthogonal to the longitudinal axis of the conductors in the example connectors. For ease of illustration, the examples shown primarily include two pairs of conductors. However, such example configurations may be embodied in any electrical connector including two or more pairs of conductors.

As will be described below, each example electrical connector includes at least two pairs of conductors, each defining either a signal conductor/ground pair or a differential pair, separated at least partially from each other by EMI absorbing material 16. As provided, EMI absorbing material 16 is configured to attenuate, primarily by absorption, an electromagnetic field generated due to transmission of electrical signals via one of the first pair and second pair of conductors to reduce the electromagnetic inference from the electromagnetic field on the other of the first pair and second pair of conductors. To the extent that the EMI absorbing material attenuates the electromagnetic field between respective conductors forming the conductive pairs in any of the example configurations, the percent attenuation is less than percent attenuation of the electromagnetic field provided by the EMI absorbing material separating the one pair of conductors from the other pair of conductors.

Figure 2A:
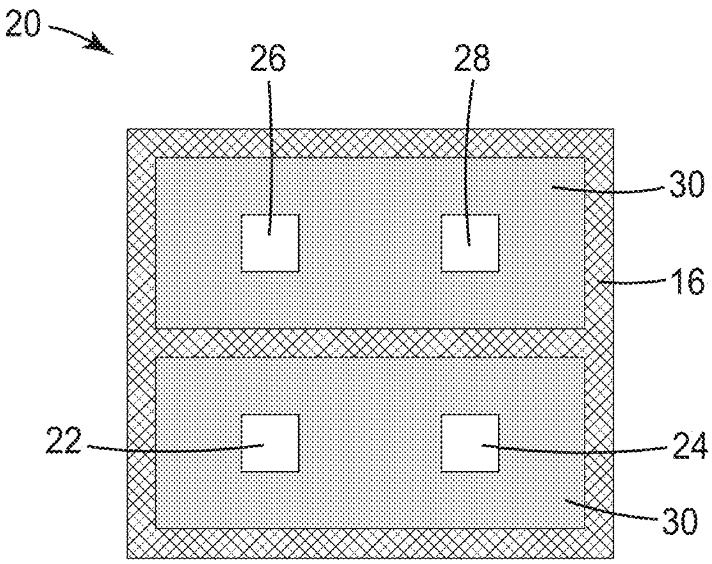
FIGS. 2A-2E are schematic diagrams illustrating various example electrical connector configurations including EMI absorbing material.

As shown in FIG. 2A, electrical connector 20 includes conductors 22, 24, 26, and 28. Conductors 22 and 24 define a first pair of conductors 25 and conductors 26 and 28 define a second pair of conductors 29. In particular, conductors 22 and 24, and conductors 26 and 28 may each be configured as signal conductors, in which case electrical connector 20 may include two differential pairs of conductors. Alternatively, one of conductor 22 and conductor 24 may be configured as a signal conductor and the other of conductor 22 and conductor 24 may be configured as a grounded conductor to define a signal conductor/ground pair. Similarly, in some examples, one of conductor 26 and conductor 28 may be configured as a signal conductor and the other of conductor 26 and conductor 28 may be configured as a grounded conductor to define a signal conductor/ground pair.

Electrical connector 20 also includes dielectric insulating material 30 separating each respective conductor of first pair 25 and second pair 29 from each other, and also separates EMI absorbing material from conductors 22, 24, 26, and 28. EMI absorbing material 16 surrounds conductors 22 and 24 to enclose first conductive pair 25 defined by conductors 22 and 24. EMI absorbing material 16 also surrounds conductors 26 and 28 to enclose second conductive pair 29 defined by conductors 26 and 28. As shown, EMI absorbing material at least partially separates first conductor pair 25 defined by conductors 22 and 24 from second conductor pair 29 defined by conductors 26 and 28. In such a configuration, EMI absorbing material may attenuate an electromagnetic field generated by the transmission of electrical signals through either conductor 22 and 24 defining first conductor pair 25 to reduce the interference caused by the electromagnetic field on second conductor pair 29 defined by conductors 26 and 28, and vice versa.

While electrical connector 20 is shown in FIG. 2*a* as not including EMI absorbing material 16 between conductors 26 and 28, as well as between conductors 22 and 24, in other examples, EMI absorbing material 16 may be disposed between conductors 22 and 24, and/or conductors 26 and 28. However, in some examples having such a configuration, to the extent that the EMI absorbing material attenuates the electromagnetic field between respective conductors forming the conductive pairs (e.g., conductors 22 and 24), the percent attenuation is less than the percent attenuation of the electromagnetic field provided by the EMI absorbing material separating the one pair of conductors (e.g., conductors 22 and 24) from the other pair of conductors (e.g., conductors 26 and 28). That is, in an example in which EMI absorbing material 16 is disposed between conductors 22 and 24, to the extent that the EMI absorbing material between conductors 22 and 24 attenuates an electromagnetic field, the percent of such attenuation is less than the that of the percent attenuation of the electromagnetic field provided by the EMI absorbing material 16 separating the conductor pair formed by conductors 22 and 24 from the conductor pair formed by conductors 26 and 28.

Figure 2B:
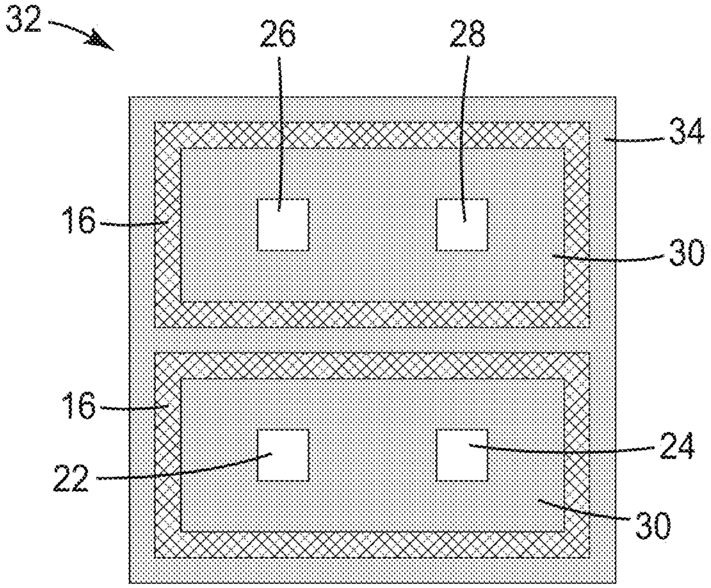

Electrical connector 32 shown in FIG. 2B includes conductors 22, 24, 26, and 28, dielectric material 30, and EMI absorbing material 16, and may be substantially similar to that of electrical connector 20 (FIG. 2A). However, in electrical connector 32, EMI absorbing material 16 includes two separate portions surrounding respective pairs of conductors 25 and 29. The portions of EMI absorbing material 16 are each surrounded by dielectric insulating material 34, which also serves to separate the two portions of EMI absorbing material 16. Dielectric insulating material 34 may be any suitable dielectric insulating material, such as, e.g., those materials described above, and may be the same or different composition of dielectric material 30.

Figure 2C:
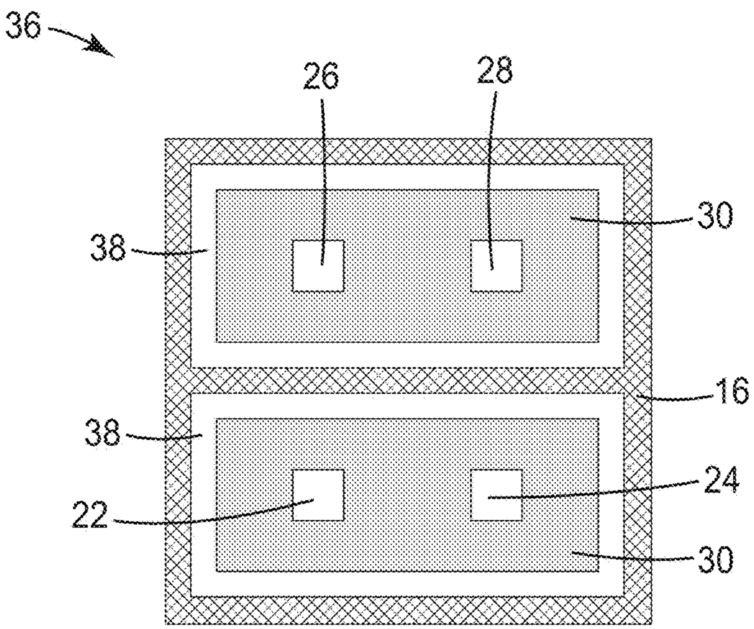

Electrical connector 36 shown in FIG. 2C includes conductors 22, 24, 26, and 28, dielectric material 30, and EMI absorbing material 16, and again may be substantially similar to that of electrical connector 20 (FIG. 2A). However, in electrical connector 36, shield material 38 surrounds first pair of conductors 25 and second pair of conductors 29, and is disposed between conductors 22, 24, 26, 28 and EMI absorbing material 16. Shield material 38 may be any suitable electromagnetic shielding material, such as, e.g., those materials described above. As provided, shield material 38 may attenuate, primarily by reflection, an electromagnetic field generated due to transmission of electrical signals via the first pair conductors 25 to reduce the electromagnetic inference from the electromagnetic field on the second pair of conductors 29, and vice versa. Such attenuation may supplement the attenuation provided by EMI absorbing material, which may attenuate a generated electromagnetic field primarily through absorption rather than reflection. In some examples, shield material 38 may be grounded and may be used as a reference for one or more signal conductor to define one or more signal conductor/ground pair.

Figure 2D:
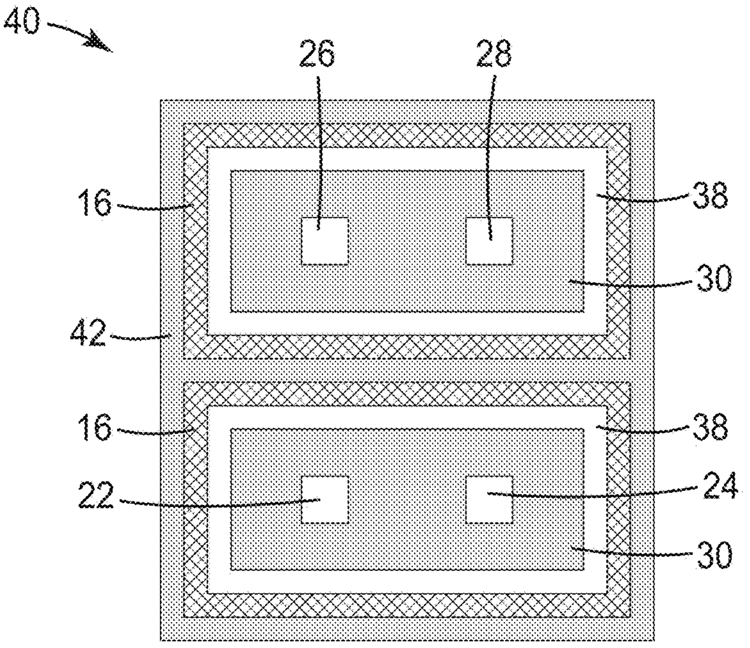

Electrical connector 40 shown in FIG. 2D includes conductors 22, 24, 26, and 28, dielectric material 30, EMI absorbing material 16, and shield material 38, and may be substantially similar to that of electrical connector 36 (FIG. 2D). However, in electrical connector 40, EMI absorbing material 16 includes two separate portions surrounding respective pairs of conductors 25 and 29 (similar to that of electrical connector 32 (FIG. 2B)). The portions of EMI absorbing material 16 are each surrounded by dielectric insulating material 42, which also serves to separate the two portions of EMI absorbing material 16. Dielectric insulating material 42 may be any suitable dielectric insulating material, such as, e.g., those dielectric insulating materials described above, and may be the same or different composition of dielectric material 30.

Figure 2E:
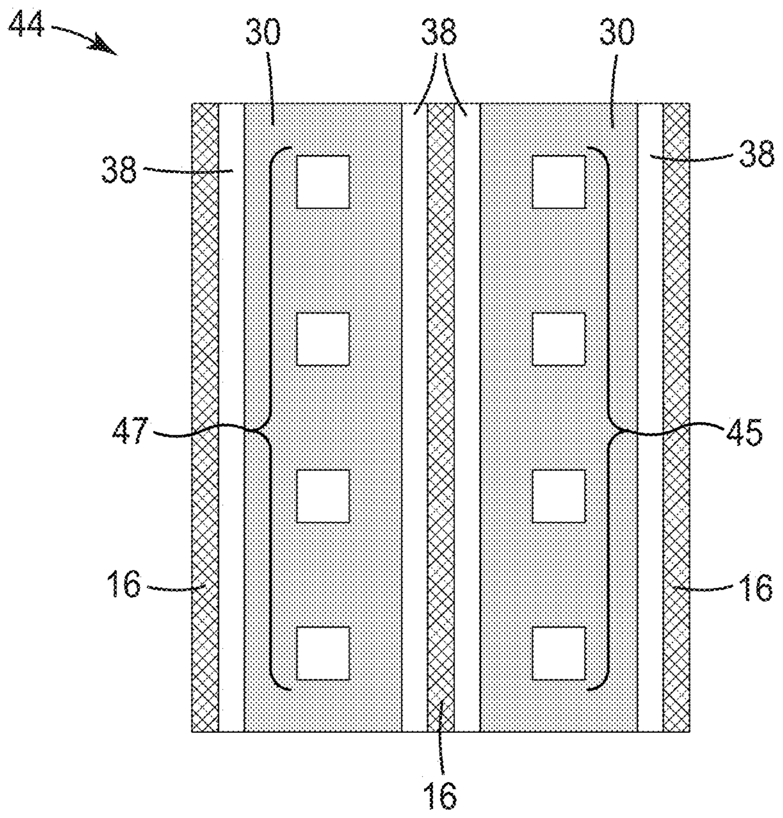

Electrical connector 44 shown in FIG. 2E includes first plurality of conductors 45, second plurality of conductors 47, dielectric material 30, EMI absorbing material 16, and shield material 38. Shield material 38 may be grounded such that each conductor of first plurality of conductors 45 defines a signal conductor/ground pair with an adjacent portion of shield material 38. Similarly, each conductor of second plurality of conductors 47 may define a signal conductor/ground pair with an adjacent portion of shield material 38. Alternatively, first plurality of conductors 45 may define two differential pairs of conductors. Similarly, second plurality of conductors 47 may define two differential pairs of conductors.

In the configuration shown in FIG. 2E, each of pair of conductors defined at least in part by first plurality of conductors 45 is separated from each pair of conductors that is at least partially defined by second plurality of conductors 47 by EMI absorbing material 16 as well as shield material 38. In this manner, EMI absorbing material 16 and/or shield material 38 may attenuate an electromagnetic field generated by the transmission of electrical signals via first plurality of conductors 45 to reduce the interference from the generated electromagnetic field on one or more of the pairs of conductors define at least in part by second plurality of conductors 47, and vice versa. An alternate example of connector 44 in which shields 38 are not present is also contemplated.

Figure 3:
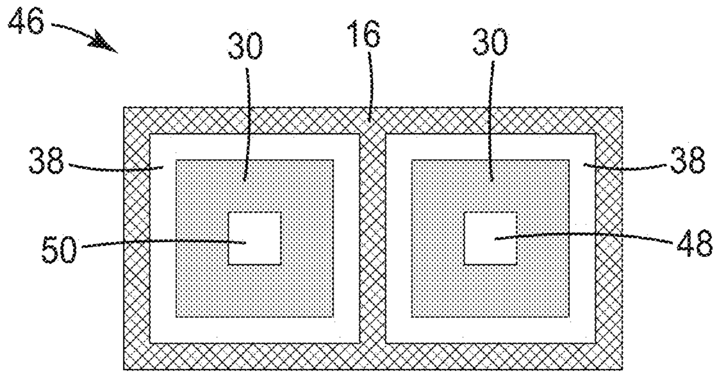
FIG. 3 is a schematic diagram illustrating another example electrical connector configuration including EMI absorbing material.

FIG. 3 is a schematic diagram illustrating another example electrical connector 46 including EMI absorbing material 16. For clarity, electrical connector 46 is shown as a cross-sectional view taken along a plane substantially orthogonal to longitudinal axis of conductors 48, 50.

Electrical connector 46 includes conductors 48 and 50, dielectric insulating material 30, shield material 38, and EMI absorbing material 16. Dielectric insulating material 30 surrounds each of conductor 48 and conductor 50. Shield material 38 includes two separate portions each surrounding one of conductor 48 and conductor 50 as well as dielectric material 30 surrounding the respective conductor. In each instance, shield material 38 may be grounded. In this manner, conductor 48 and the portion of shield material 38 surrounding conductor 48 may define a signal conductor/ground pair, and conductor 50 and the portion of shield material 38 surrounding conductor 50 may also define a signal conductor/ground pair. Each signal conductor/ground pair defined by conductor 48, conductor 50, and grounded shield material 38 is surrounded by EMI absorbing material 16.

As shown, electrical connector 46 includes conductor 48 surrounded by a first portion of grounded shield 38 to form pair of conductors defining a signal conductor/ground pair. Dielectric material 30 separates conductor 48 from the first portion of grounded shield 38. Similarly, electrical connector 46 includes conductor 50 surrounded by a second portion of grounded shield 38 to form another pair of conductors defining a signal conductor/ground pair. While conductors 48 and 50 are each shown an being completely surrounded by respective portion of shield material 38, in some examples, shield material 38 may only partially surround one or both of conductors 48 and 50. Dielectric material 30 separates conductor 50 from the grounded shield 38. Electrical connector 46 further includes EMI absorbing material 16 surrounding both the first and second pairs of conductors defined by conductors 48, 50, and shield material 38.

In electrical connector 46, EMI absorbing material 16 at least partially separates the respective pairs of conductors defined by conductors 48, 50, and shield material 38. As configured, during transmission of electrical signals via one or both of the signal conductor/ground pairs, EMI absorbing material 16 may attenuate, primarily through absorption, the electromagnetic field resulting from the electrical signal transmission in a manner that reduces the interference between the respective pairs of conductors. In some instances, the electromagnetic fields within electrical connector 46 may be further attenuated by shield material 38, primarily through reflection, to further reduce the interference between respective pairs of conductors.

Figure 4:
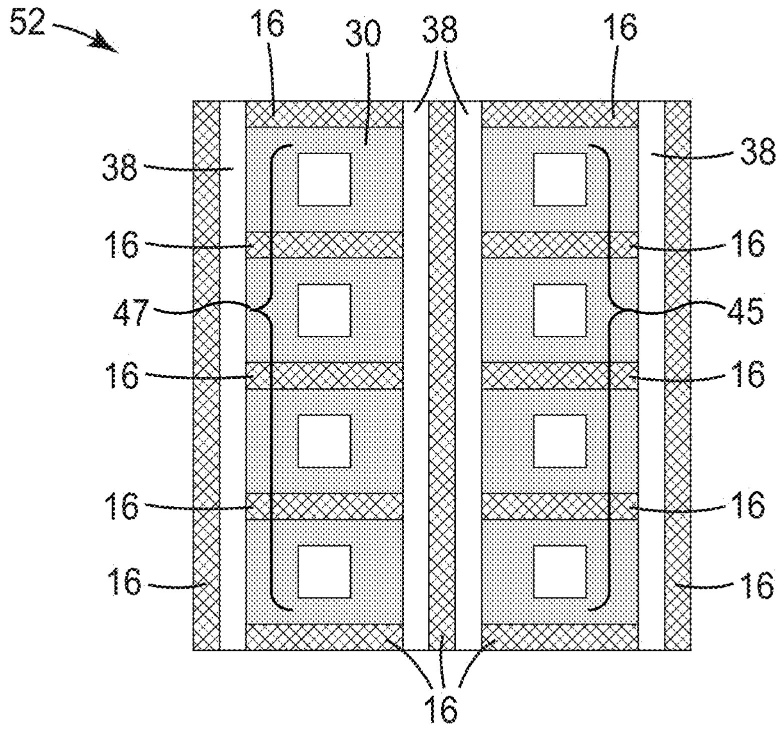
FIG. 4 is a schematic diagram illustrating another example electrical connector configuration including EMI absorbing material.

FIG. 4 is a schematic diagram illustrating another example electrical connector 52 including EMI absorbing material 16. Electrical connector 52 includes first plurality of conductors 45, second plurality of conductors 47, dielectric material 30, EMI absorbing material 16, and shield material 38. First plurality of conductors 45 and second plurality of conductors 47 are each arranged in stripline configuration adjacent to one another. First plurality of conductors 45 and second plurality of conductors 47 are separated by EMI absorbing material 16 and shield material 38. Shield material 38 may be grounded such that respective conductors of first and second plurality of conductors 45, 47 define signal conductor/ground pairs with shield material 38.

As shown, the configuration of electrical connector 52 may be substantially similar to that of electrical connector 44 shown in FIG. 2E. However, unlike that of electrical connector 44 (FIG. 2E) respective conductors in each of first plurality of conductors 45 and second plurality of conductors 47 are separated from one another by portions of EMI absorbing material 16. As configured, during transmission of electrical signals via one or more of the signal conductor/ground pairs defined from electrical connector 52, EMI absorbing material 16 may attenuate, primarily through absorption, the electromagnetic field resulting from the electrical signal transmission in a manner that reduces the interference between other pairs of conductors in electrical connector 52. In some instances, the electromagnetic fields within electrical connector 52 may be further attenuated by shield material 38, primarily through reflection, to further reduce the interference between respective pairs of conductors.

Figure 5:
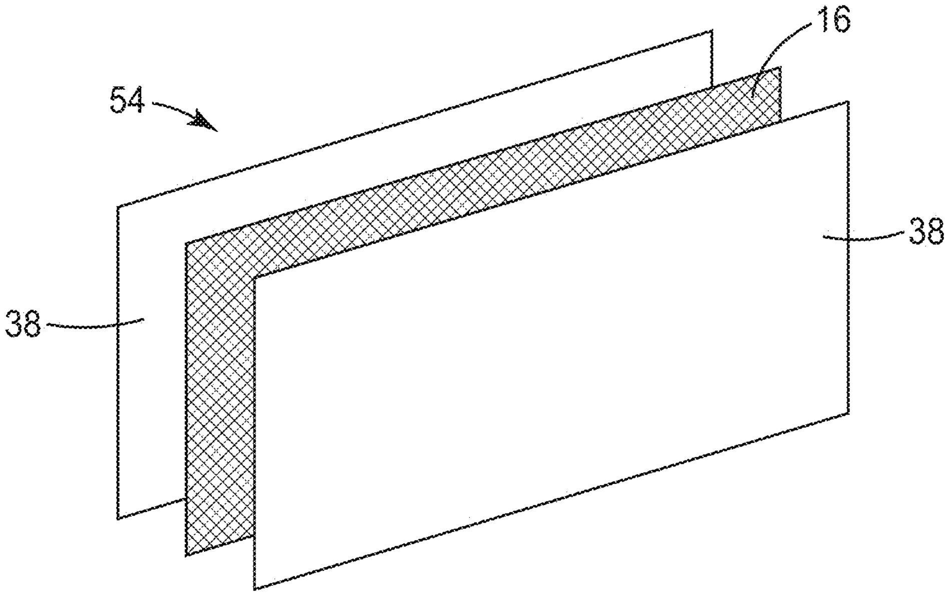
FIG. 5 is a schematic diagram illustrating an example multilayer shield and EMI absorbing material configuration.

FIG. 5 is a schematic diagram illustrating an example multilayer configuration 54 including shield material 38 and EMI absorbing material 16. As noted above, in some examples, the combination of EMI absorbing material 16 and shielding material 38 may be used in place of only EMI absorbing material 16, e.g., to at least partially separate two or more pairs of conductors in an electrical connector. The combination of EMI absorbing material 16 and shielding material 38 may serve to attenuate electromagnetic fields generated within an electrical connector. In operation, the EMI absorbing material 16 may attenuate an electromagnetic field generated by transmission of electrical signal via a pair of conductors primarily through absorption, while shield material 38 may attenuate an electromagnetic field generated by transmission of electrical signal via a pair of conductors primarily through reflection. In some examples, the combination of EMI absorbing material 16 and shield material 38 may provide for attenuation of an electromagnetic field to a degree that is greater than that provided by each material individually.

In the example shown in FIG. 5, multilayer configuration 54 includes a two layers of shield material 38 separated by EMI absorbing material 16. However, other configurations are contemplated. In some examples, two layers of EMI absorbing material 16 may be separated by shield material 38, or a single layer of EMI absorbing material 16 may be combined with a layer of shield material on the front side and/or back side with respect to a pair of conductors surrounded by the layer of EMI absorbing material 16. In some examples, by including one or more layer of shield material 38 on the back side of EMI absorbing material 16, electromagnetic waves not absorbed by the layer of EMI absorbing material 16 may be reflected back to the layer of EMI absorbing material 16 by shield material 38 for further absorption by EMI absorbing material 16. Examples are not limited to two or three layer configurations but may include any suitable number of layers on EMI absorbing material 16 and shield material 38 in an alternating configuration.

As shown in FIG. 5, in some examples, one or both layers of shield material 38 may be perforated layers having a plurality of holes extending through the layer of shield material 38. In general, the perforations in the layers of shield material 38 may serve to scatter as well as reflect electromagnetic waves to attenuate an electromagnetic field. The scattering of the electromagnetic field may serve to delocalize the electromagnetic field attenuated by the multilayer structure over a greater area. In this manner, the absorption of electromagnetic waves by EMI absorbing material 16 may be increased due the scattering of EMI waves by the adjacent layers of shield material 38, and may improve the overall attenuation provided by EMI absorbing material 16 primarily through absorption.

For the instance in which a layer of shield material 38 is perforated, the holes may be provided in the layer of shield material in any suitable pattern and size. For example, the holes may be provided in a grid-like pattern in the layer of shield material 38. In some instances, the size of the holes in the layer of shield material may be less than the wavelength of the electromagnetic waves intended to be reflected by shield material 38. In some examples, the spacing of the holes from center to center may be approximately onequarter of the wavelength of the electromagnetic waves intended to be reflected by shield material 38.

Any suitable technique may be used to form example electrical connectors described in this disclosure. In some examples, EMI absorbing materials 16 may be applied to an electrical connector in the example configuration described using molding, injection, coating, and/or film application techniques.

EXAMPLES

The following example is illustrative of one or more embodiments of the disclosure, but do not limit the scope of the disclosure.

To evaluate the influence of EMI absorbing material on the signal integrity within an electrical connector including multiple pairs of conductors, two example electrical connectors were constructed. The configuration of the two electrical connectors was substantially the same except one electrical connector included EMI absorbing material in accordance with one or more examples of the disclosure, while the other electrical connector did not include EMI absorbing material. The crosstalk performance of each electrical connector was then evaluated as described below.

Figure 6:
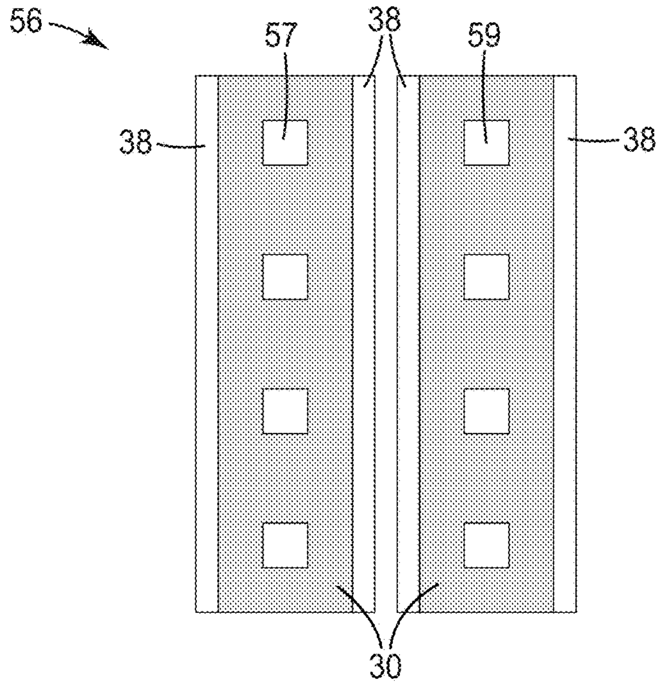
FIGS. 6 and 7 are schematic diagrams illustrating example electrical connectors without and with, respectively, EMI absorbing material.
Figure 7:
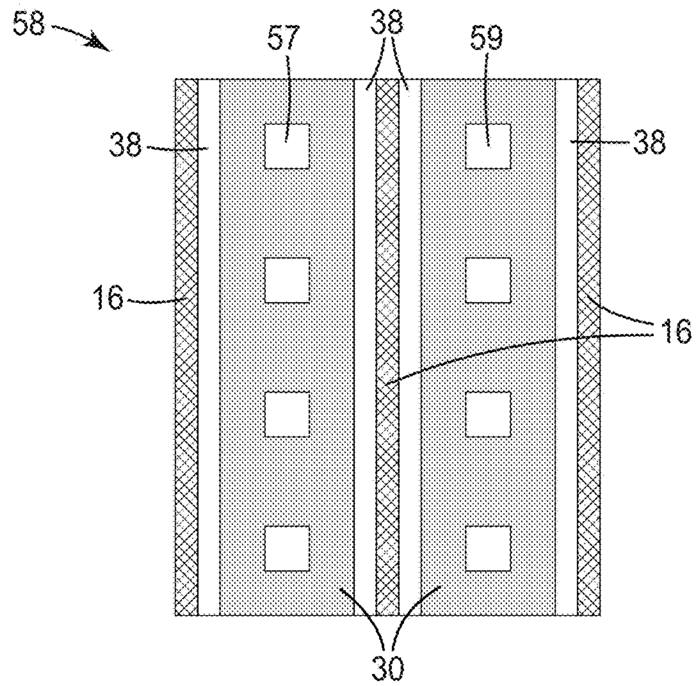

FIG. 6 is a schematic diagram illustrating the example electrical connector 56 that did not include EMI absorbing material, and FIG. 7 is a schematic diagram illustrating an example electrical connecter 58 that did include EMI absorbing material 16. As shown, each electrical connector included columns of multiple signal conductors (e.g., conductors 57 and 59) separated by dielectric insulator material 30 and shield material 38. However, electrical connector 58 also included EMI absorbing material 16 separating the columns of signal conductors and shield material 38 in the configuration shown in FIG. 7. The EMI absorbing material 16 used in electrical connector 58 was 3M AB3010 EMI Absorber (produced by 3M, Maplewood, Minn.), which is a carbonyl iron powder-based material. The thickness of EMI absorbing material was approximately 8 mils. The shielding material was Cu and the dielectric insulator material 30 was liquid crystal polymer with a dielectric constant of approximately 3.4.

For ease of illustration only two columns of four conductors are represented in FIGS. 6 and 7. In actuality, the example electrical connectors used in the example simulations include eight rows of the conductors arranged in four columns. Table 1 and Table 2 below are representative of the actual configuration of both example electrical connectors. Table 1 represents the differential near end ports, and Table 2 represents the differential far end ports for the S-parameter measurements below. The numbers and shading in Tables 1 and 2 are representative of differential pairs in both electrical connector configurations. The coupling between the CD pair in column 3 to the EF pair in column 4 were used to evaluate the crosstalk performance of electrical connectors 56 and 58 relative to one another.

TABLE 1

| | Diff Near End Ports | | | |
|---|---|---|---|---|
| | 1 | 2 | 3 | 4 |
| H | 15 | G | 13 | G |
| G | | G | | G |
| F | G | 11 | G | 9 |
| E | G | | G | |
| D | 7 | G | 5 | G |
| C | | G | | G |
| B | G | 3 | G | 1 |
| A | G | | G | |

TABLE 2

| | Diff Far End Ports | | | |
|---|---|---|---|---|
| | 1 | 2 | 3 | 4 |
| H | 16 | G | 14 | G |
| G | | G | | G |
| F | G | 12 | G | 10 |
| E | G | | G | |
| D | 8 | G | 6 | G |
| C | | G | | G |
| B | G | 4 | G | 2 |
| A | G | | G | |

The crosstalk performance of the two example connector designs shown in FIGS. 6 and 7 was compared by simulating the transmission of electrical signals via each respective connector using Computer Simulation Technology (CST) Microwave Studio software (commercially available from CST Computer Simulation Technology, Framingham, Mass.). Two differential pairs in the respective electrical connectors were used to assess the difference in crosstalk performance. In particular, the coupling between the "CD" differential pair in column 3 and the "EF" differential pair in column 4 (as indicated in Tables 1 and 2) were used to gauge the crosstalk performance in terms of S-parameter measurements at signal frequencies between zero and approximately 20 GHz. Measurement of the S-parameter for differential port 5 and differential port 9 was selected to evaluate differential near end crosstalk performance. Measurement of the S-parameter for differential port 5 and differential port 10 was selected to evaluate differential far end crosstalk performance.

Figure 8A:
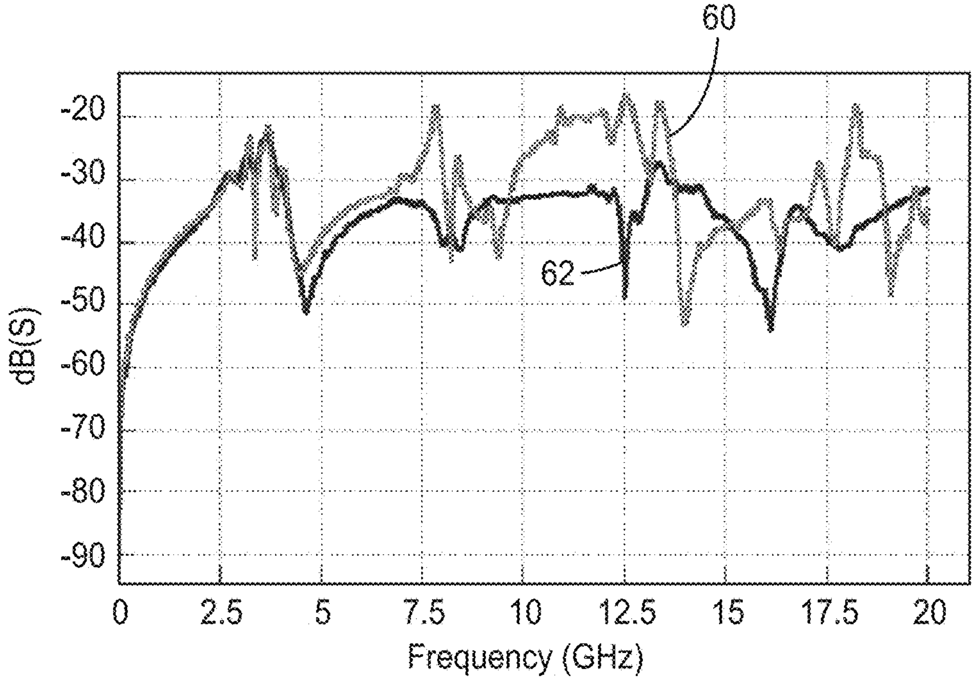
FIGS. 8A and 8B are plots illustrating S-parameter measurements versus signal frequency from simulations performed on the example electrical connectors of FIGS. 6 and 7.
Figure 8B:
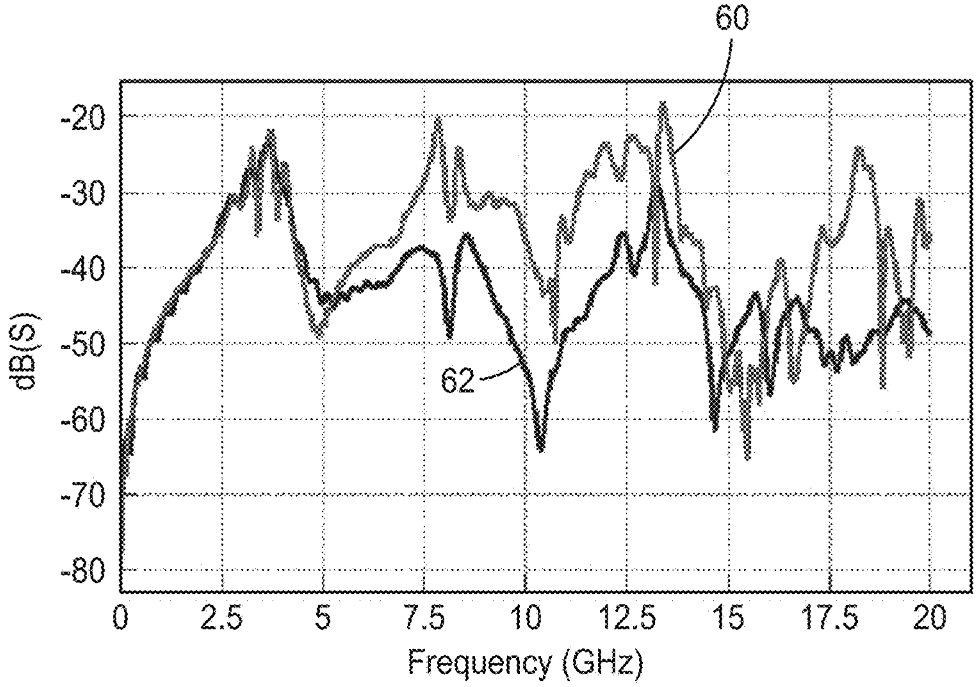

FIG. 8A is a plot illustrating the S-parameter versus signal frequency for the near end differential ports for each example connector. FIG. 8B is a plot illustrating the S-parameter versus signal frequency for the near end differential ports for each example connector. In each case, line 60 corresponds to electrical connector 56 (FIG. 6) which did not include EMI absorbing material, and line 62 correspond to electrical connector 58 (FIG. 7) which included EMI absorbing material.

As illustrated in FIGS. 8A and 8B, up to approximately 5 GHz, the crosstalk between the selected pairs in both simulations is about the same. However, between about 5 GHz and 20 GHz, the response of the example configuration including the EMI absorbing material showed improvement in the crosstalk on the order of 10 dB to 15 dB in some regions of the frequency spectrum. Overall, there was generally an improvement in crosstalk across this frequency spectrum, which may be attributed to the inclusion of the EMI absorbing material. Peak near end crosstalk without the EMI absorbing material is higher than −20 dB. With the addition of the EMI absorbing material to attenuate a generated electromagnetic material, the peak near end crosstalk does not cross −30 dB until the frequency is above approximately 13 GHz. Similar performance improvement for far end crosstalk can be seen in FIG. 8B.

In addition to the above results, it is predicted that, in some cases, the level of improvement and the frequency range of effectiveness with regard to crosstalk between respective pairs of conductors can be tailored based on the selection of EMI absorbing material, e.g., to adjust the resistivity, dielectric constant, loss tangent value, and/or magnetic permeability of the EMI absorbing material. For example, an EMI absorbing material may additionally be provided in electrical connector 58 (FIG. 7) in a manner that improves crosstalk over electrical connector 56 (FIG. 6) between zero and approximately 5 GHz and/or further improves the crosstalk performance between about 5 GHz and 20 GHz.

Various embodiments of the invention have been described. These and other embodiments are within the scope of the following claims.

Following are exemplary embodiments of electrical connectors including electromagnetic interference (emi) absorbing material according to aspects of the present invention.

Embodiment 1 is an electrical connector comprising: a first pair of conductors; a second pair of conductors; and electromagnetic interference (EMI) absorbing material at least partially separating the first pair of conductors from the second pair of conductors, wherein each of the first pair and second pair of conductors define one of a differential pair or a signal conductor/ground pair, wherein the EMI absorbing material is configured to attenuate, primarily by absorption, an electromagnetic field generated due to transmission of electrical signals via one of the first pair and second pair of conductors to reduce the electromagnetic inference from the electromagnetic field on the other of the first pair and second pair of conductors, and wherein any percent attenuation of an electromagnetic field between the respective conductors provided by the EMI absorbing material is less than a percent attenuation of the electromagnetic field provided by the EMI absorbing material separating the first pair of conductors from the second pair of conductors.

Embodiment 2 is the electrical connector of embodiment 1, further comprising an electrically conductive shield member at least partially surrounding at least one of the first pair of conductors and the second pair of conductors, the shield being configured to attenuate electromagnetic field primarily by reflection.

Embodiment 3 is the electrical connector of embodiment 2, wherein the shield member is configured to reduce crosstalk between the first pair of conductors and second pair of conductor during transmission of electrical signals via the first pair of conductors and second pair of conductors, wherein the EMI absorbing material is configured to reduce the crosstalk between the first pair of conductors and second pair of conductors in combination with the shield member to a desired level beyond the reduction provided only by the shield member.

Embodiment 4 is the electrical connector of embodiment 2, wherein the shield member comprises a first shield member surrounding the first pair of conductors and a second shield member surrounding the second pair of conductors, wherein the EMI absorbing material is interposed between the first shield member and second shield member.

Embodiment 5 is the electrical connector of embodiment 4, further comprising a dielectric material surrounding and separating a combination of the first pair of conductors and the first shield member from a combination of the second pair of conductors and second shield member.

Embodiment 6 is the electrical connector of embodiment 2, wherein the shield member is grounded.

Embodiment 7 is the electrical connector of embodiment 2, wherein the EMI absorbing material is interposed between the shield member and at least one of the first pair of conductors and second pair of conductors.

Embodiment 8 is the electrical connector of embodiment 2, wherein the shield member is interposed between the EMI absorbing material and at least one of the first pair of conductors and second pair of conductors.

Embodiment 9 is the electrical connector of embodiment 2, wherein the shield member is formed at least partially of a perforated metal layer located adjacent the EMI absorbing material.

Embodiment 10 is the electrical connector of embodiment 1, wherein the EMI absorbing material comprises a ferromagnetic material.

Embodiment 11 is the electrical connector of embodiment 1, wherein the first and second pairs of conductors are configured to transmit data at rates greater than 1 Gb/s, wherein the EMI absorbing material is configured to improve the crosstalk between the first and second pairs of conductors by at least 3 dB during transmission of the data.

Embodiment 12 is the electrical connector of embodiment 1, wherein the first pair of conductors are located less than about 4 millimeters from the second pair of conductors.

Embodiment 13 is the electrical connector of embodiment 1, further comprising a shielding material, wherein the EMI absorbing material and the shielding material form a multi-layer structure including alternating layers of EMI absorbing material and the shielding material at least partially separating the first pair of conductors from the second pair of conductors.

Embodiment 14 is the electrical connector of embodiment 1, wherein any attenuation of an electromagnetic field between the respective conductors provided by the EMI absorbing material is less than the attenuation of the electromagnetic field provided by the EMI absorbing material separating the first pair of conductors from the second pair of conductors.

Embodiment 15 is a method comprising transmitting data via the electrical connector of embodiment 1.

Embodiment 16 is an electrical assembly comprising: a first electrical connector; a second electrical connector mated with the first electrical connector; a first pair of conductors and a second pair of conductors, wherein each of the first pair and second pair of conductors define one of a differential pair or a signal conductor/ground pair; and electromagnetic interference (EMI) absorbing material at least partially separating the first pair of conductors from the second pair of conductors when the first connector is mated with the second electrical connector, wherein the EMI absorbing material is configured to attenuate, primarily by absorption, an electromagnetic field generated due to transmission of electrical signals via one of the first pair and second pair of conductors to reduce the electromagnetic inference from the electromagnetic field on the other of the first pair and second pair of conductors, and wherein any percent attenuation of an electromagnetic field between the respective conductors provided by the EMI absorbing material is less than a percent attenuation of the electromagnetic field provided by the EMI absorbing material separating the first pair of conductors from the second pair of conductors.

Embodiment 17 is the electrical assembly of embodiment 16, wherein substantially all of the EMI absorbing material is within the first electrical connector when the first and second electrical connectors are in an unmated configuration.

Embodiment 18 is the electrical assembly of embodiment 16, wherein the first electrical connector and second electric each include respective portions of the EMI absorbing material the first and second electrical connectors are in an unmated configuration.

Embodiment 19 is the electrical assembly of embodiment 16, further comprising an electrically conductive shield member, wherein the shield member at least partially surrounds at least one of the first pair of conductors and the second pair of conductors when the first and second electrical connectors are in a mated configuration.

Embodiment 20 is the electrical assembly of embodiment 19, wherein the shield member is configured to reduce crosstalk between the first pair of conductors and second pair of conductor during transmission of electrical signals via the first pair of conductors and second pair of conductors, wherein the EMI absorbing material is configured reduce crosstalk between the first pair of conductors and second pair of conductors in combination with the shield member to a desired level beyond the reduction provided only by the shield member.

Embodiment 21 is the electrical assembly of embodiment 19, wherein the shield member comprises a first shield member surrounding the first pair of conductors and a second shield member surrounding the second pair of conductors, wherein the EMI absorbing material is interposed between the first shield member and second shield member.

Embodiment 22 is the electrical assembly of embodiment 21, further comprising a dielectric material surrounding and separating a combination of the first pair of conductors and the first shield member from a combination of the second pair of conductors and second shield member.

Embodiment 23 is the electrical assembly of embodiment 19, wherein the EMI absorbing material is interposed between the shield member and at least one of the first pair of conductors and second pair of conductors.

Embodiment 24 is the electrical assembly of embodiment 19, wherein the shield member is interposed between the EMI absorbing material and at least one of the first pair of conductors and second pair of conductors.

Embodiment 25 is the electrical assembly of embodiment 19, wherein the shield member is formed at least partially of a perforated metal layer located adjacent the EMI absorbing material.

Embodiment 26 is the electrical assembly of embodiment 16, wherein the EMI absorbing material comprises a ferromagnetic material.

Embodiment 27 is the electrical assembly of embodiment 16, wherein the first and second pairs of conductors are configured to transmit data at rates greater than 1 Gb/s when the first and second electrical connectors are mated with one another, wherein the EMI absorbing material is configured to improve the crosstalk between the first and second pairs of conductors be at least 3 dB during transmission of the data.

Embodiment 28 is the electrical assembly of embodiment 16, wherein the first pair of conductors are located less than about 4 millimeters from the second pair of conductors within the first and second electrical connectors.

Embodiment 29 is the electrical assembly of embodiment 16, wherein one of the first electrical connector and the second electrical connector is a male connector including a plurality of pins and the other of the first electrical connector and the second electrical connector is a female connector including a plurality of receptacles for receiving the plurality of pins when the first electrical connector is mated with the second electrical connector.

Embodiment 30 is the electrical assembly of embodiment 16, further comprising a shielding material, wherein the EMI absorbing material and the shielding material form a multilayer structure including alternating layers of EMI absorbing material and the shielding material at least partially separating the first pair of conductors from the second pair of conductors when the first connector is mated with the second electrical connector.

Embodiment 31 is the electrical connector of embodiment 16, wherein any attenuation of an electromagnetic field between the respective conductors provided by the EMI absorbing material is less than the attenuation of the electromagnetic field provided by the EMI absorbing material separating the first pair of conductors from the second pair of conductors.

Embodiment 32 is a method comprising transmitting data via the electrical assembly of embodiment 16.

Embodiment 33 is an electrical connector comprising: a first pair of conductors comprising a first conductor at least partially surrounded by a first grounded shield to define a first signal conductor/ground pair; a first dielectric layer separating the first conductor from the first grounded shield; a second pair of conductors comprising a second conductor at least partially surrounded by a second grounded shield to define a second signal conductor/ground pair; a second dielectric layer separating the second conductor from the second grounded shield; and electromagnetic interference (EMI) absorbing material surrounding both the first and second pairs of conductors.

Embodiment 34 is the electrical connector of embodiment 33, wherein the EMI absorbing material is configured to attenuate an electromagnetic field generated due to transmission of electrical signals via one of the first pair and second pair of conductors to reduce the electromagnetic inference from the electromagnetic field on the other of the first pair and second pair of conductors.

Embodiment 35 is the electrical connector of embodiment 33, wherein the first and second dielectric materials comprise at least one of liquid crystal polymer (LCP), polybutylene terephthalate (PBT), polycyclohexylene dimethylene terephthalate (PCT), and high temperature nylon (HTN).

Embodiment 36 is the electrical connector of embodiment 33, wherein at least one of the first grounded shield and the second grounded shield is formed at least partially of a perforated metal layer located adjacent the EMI absorbing material.

Embodiment 37 is the electrical connector of embodiment 33, wherein the EMI absorbing material comprises a ferromagnetic material.

Embodiment 38 is the electrical connector of embodiment 33, wherein the first and second pairs of conductors are configured to transmit data at rates greater than 1 Gb/s, wherein the EMI absorbing material is configured to improve the crosstalk between the first and second pairs of conductors by at least 3 dB during transmission of the data.

Embodiment 39 is the electrical connector of embodiment 33, wherein the first pair of conductors are located less than about 4 millimeters from the second pair of conductors.

Embodiment 40 is a method comprising transmitting data via the electrical connector of embodiment 33.

Embodiment 41 is an electrical connector comprising: a first plurality of conductors; a second plurality of conductors adjacent to the first plurality of conductors; electromagnetic interference (EMI) absorbing material; and a grounded shield member, wherein the first plurality of conductors and the grounded shield member form a first plurality of signal conductor/ground pairs and the second plurality of conductors and the grounded shield member form a second plurality of signal conductor/ground pairs, wherein the first plurality of conductors are separated from the second plurality of conductors by the grounded shield member and the EMI absorbing material, and wherein respective conductors of the first plurality of conductors are separated from one another by the EMI absorbing material.

Embodiment 42 is the electrical connector of embodiment 41, wherein the EMI absorbing material is configured to attenuate an electromagnetic field generated due to transmission of electrical signals via a respective signal/ground pair of the first plurality of signal/ground pairs or second plurality of signal/ground pairs of to reduce the electromagnetic inference from the electromagnetic field on the other signal/ground pairs of first plurality of signal/ground pairs and second plurality of signal/ground pairs.

Embodiment 43 is the electrical connector of embodiment 41, further comprising dielectric material separating respective conductors of the first and second plurality of conductors from the grounded shield member.

Embodiment 44 is the electrical connector of embodiment 43, wherein the dielectric materials comprise at least one of liquid crystal polymer (LCP), polybutylene terephthalate (PBT), polycyclohexylene dimethylene terephthalate (PCT), and high temperature nylon (HTN).

Embodiment 45 is the electrical connector of embodiment 41, wherein at least a portion of the grounded shield member is formed of a perforated metal layer located adjacent the EMI absorbing material.

Embodiment 46 is the electrical connector of embodiment 41, wherein the EMI absorbing material comprises a ferromagnetic material.

Embodiment 47 is the electrical connector of embodiment 41, wherein the respective conductors of the first plurality of conductors are not separated from one another by a shield material.

Embodiment 48 is a method comprising transmitting data via the electrical connector of embodiment 41.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very vide variety of embodiments. This application is intended to cover any adoptions or variations of the preferred embodiments discussed herein. Therefore, it is manifestly intended that this invention be limited only by the claims and the equivalents thereof.

What is claimed is:

1. An assembly comprising first and second pairs of conductors, each pair of conductors surrounded by a multilayer structure comprising alternating layers of EMI absorbing material and shielding material, the first pair of conductors separated from the second pair of conductors by a multilayer structure comprising at least two spaced apart layers of EMI absorbing material and at least two layers of shielding material separated by a layer of a dielectric insulting material, the EMI absorbing and shielding materials configured to attenuate an electromagnetic filed primarily by absorption and reflection, respectively.

* * * * *